(12) United States Patent
Lee et al.

(10) Patent No.: US 12,514,065 B2
(45) Date of Patent: Dec. 30, 2025

(54) ORGANIC LIGHT-EMITTING DISPLAY APPARATUS COMPRISING A STORAGE CAPACITOR HAVING THREE STORAGE CAPACITOR ELECTRODES

(71) Applicant: LG Display Co., Ltd., Seoul (KR)

(72) Inventors: Sung Jin Lee, Paju-si (KR); Dong Chae Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 464 days.

(21) Appl. No.: 17/968,283

(22) Filed: Oct. 18, 2022

(65) Prior Publication Data

US 2023/0189569 A1 Jun. 15, 2023

(30) Foreign Application Priority Data

Dec. 14, 2021 (KR) .......................... 10-2021-0178499

(51) Int. Cl.
*H01L 29/08* (2006.01)
*H10K 59/121* (2023.01)
(Continued)

(52) U.S. Cl.
CPC ..... *H10K 59/1216* (2023.02); *H10K 59/1213* (2023.02); *H10K 59/124* (2023.02);
(Continued)

(58) Field of Classification Search
CPC ........... H10K 59/1216; H10K 59/1213; H10K 59/126; H10K 59/124; H10D 86/60; H10D 86/6755
(Continued)

(56) References Cited

U.S. PATENT DOCUMENTS

2018/0175077 A1 6/2018 Koo et al.
2018/0182836 A1* 6/2018 Beak ................... H10K 59/1216
(Continued)

FOREIGN PATENT DOCUMENTS

KR 10-2018-0070334 A 6/2018
KR 20200077477 A * 6/2020
(Continued)

OTHER PUBLICATIONS

Cite the machine translation Kim D (CN-20200077477-A).*
Korean Intellectual Property Office, Office Action, Korean Patent Application No. 10-2021-0178499, Aug. 27, 2025, 11 pages.

*Primary Examiner* — Phuc T Dang
(74) *Attorney, Agent, or Firm* — Fenwick & West LLP (57) ABSTRACT

Disclosed is an organic light-emitting display apparatus including a storage capacitor including a plurality of electrodes connected to each other in parallel so as to have a high capacitance per unit area. The organic light-emitting display apparatus includes a driving thin film transistor including an oxide semiconductor pattern blocked by a first light-blocking pattern, and a storage capacitor including a first storage capacitor electrode disposed on the same layer as the first gate electrode, a second storage capacitor electrode disposed on the same layer as one of the second gate electrode and the first light-blocking pattern, and connected to the first storage capacitor electrode, and a third storage capacitor electrode disposed between the first storage capacitor electrode and the second storage capacitor electrode.

11 Claims, 8 Drawing Sheets

(51) Int. Cl.
  *H10K 59/124*  (2023.01)
  *H10K 59/126*  (2023.01)
  H10D 30/67   (2025.01)
  H10D 86/40   (2025.01)
  H10D 86/60   (2025.01)

(52) U.S. Cl.
  CPC ....... *H10K 59/126* (2023.02); *H10D 30/6723* (2025.01); *H10D 30/6755* (2025.01); *H10D 86/423* (2025.01); *H10D 86/481* (2025.01); *H10D 86/60* (2025.01)

(58) Field of Classification Search
  USPC ........................................................ 257/40
  See application file for complete search history.

(56) References Cited

U.S. PATENT DOCUMENTS

2021/0020717 A1   1/2021   Kim et al.
2021/0202634 A1   7/2021   Moon et al.

FOREIGN PATENT DOCUMENTS

KR   10-2021-0010700 A   1/2021
KR   10-2021-0086247 A   7/2021

\* cited by examiner

ORGANIC LIGHT-EMITTING DISPLAY APPARATUS COMPRISING A STORAGE CAPACITOR HAVING THREE STORAGE CAPACITOR ELECTRODES

CROSS-REFERENCE TO RELATED APPLICATION

This application claims the benefit of Republic of Korea Patent Application No. 10-2021-0178499, filed on Dec. 14, 2021, which is hereby incorporated by reference in its entirety.

FIELD OF TECHNOLOGY

The present disclosure relates to an organic light-emitting display apparatus, and more particularly, to an organic light-emitting display apparatus including a capacitor structure having a high-storage capacity even in a small area so as to realize a high-resolution display device in manufacturing an organic light-emitting display apparatus that includes a driving thin film transistor (TFT) among a plurality of TFTs and uses an oxide semiconductor as an active layer.

BACKGROUND

Recently, with the development of multimedia, the importance of flat panel display devices has been increasing. In response thereto, flat panel display devices such as a liquid crystal display device, a plasma display device, and an organic light-emitting display apparatus have been commercialized. Among these flat panel display devices, organic light-emitting display apparatuses are currently widely used due to the high response speed, high luminance, and excellent viewing angle thereof.

In such an organic light-emitting display apparatus, a plurality of pixels is disposed in a matrix arrangement, and each pixel is provided with a light-emitting element part represented by an organic light-emitting layer and a pixel circuit part represented by a TFT. The pixel circuit part includes a plurality of TFTs, such as a driving thin film transistor for supplying a driving current to operate an organic light-emitting and a switching thin film transistor for supplying a gate signal to the driving TFT. In addition, each subpixel includes a capacitor that holds a data signal for a certain period of time. As the display apparatus increases in resolution, a space in which a capacitor is installed in a subpixel tends to become narrower. A subpixel requires a capacitor of a certain capacity or more to maintain a data signal for one frame, and there is a problem in that the capacitance of the capacitor becomes smaller as the space becomes smaller.

SUMMARY

Accordingly, the present disclosure is directed to an organic light-emitting display apparatus that substantially obviates one or more problems due to limitations and disadvantages of the related art.

An object of the present disclosure is to provide a capacitor structure that provides a capacitance value of a predetermined capacitance or more in a subpixel while realizing a high resolution.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display apparatus includes a substrate including a display region and a non-display region disposed around the display region, a lower buffer layer formed on the substrate, a first thin film transistor disposed in at least one of the display region or the non-display region, the first thin film transistor including a first semiconductor pattern, a first gate electrode, a first source electrode, and a first drain electrode formed on the lower buffer layer, an upper buffer layer disposed on the first semiconductor pattern, a second thin film transistor disposed on the upper buffer layer, the second thin film transistor including a second semiconductor pattern, a second gate electrode, a second source electrode, and a second drain electrode, a first light-blocking pattern disposed between the lower buffer layer and the second semiconductor pattern, the first light-blocking pattern overlapping the second semiconductor pattern, and a storage capacitor including a first storage capacitor electrode disposed on the same layer as the first gate electrode, a second storage capacitor electrode disposed on the same layer as one of the second gate electrode and the first light-blocking pattern, and connected to the first storage capacitor electrode, and a third storage capacitor electrode disposed between the first storage capacitor electrode and the second storage capacitor electrode.

The second semiconductor pattern may be an oxide semiconductor pattern.

The second thin film transistor may be a driving thin film transistor.

The first light-blocking pattern may be electrically connected to the second source electrode.

The second storage capacitor electrode may be a metal layer disposed on the same layer as the first light-block pattern, and a sub-storage capacitor generated between the first storage capacitor electrode and the third storage capacitor electrode and a sub-storage capacitor generated between the second storage capacitor electrode and the third storage capacitor electrode may be connected to each other in parallel.

The second storage capacitor electrode may be disposed on the same layer as the second gate electrode, and the third storage capacitor electrode may be disposed on the same layer as the first light-blocking pattern.

The second storage capacitor electrode may be disposed on the same layer as the second gate electrode, and the third storage capacitor electrode may be a metal layer disposed between the first light-blocking pattern and the first gate electrode.

The second storage capacitor electrode may be disposed on the same layer as the first light-blocking pattern, and connected to the first storage electrode, and a metal layer disposed on the same layer as the second gate electrode, may be a fourth storage capacitor electrode and connected to the third storage capacitor electrode.

The first light-blocking pattern may be inserted into the upper buffer layer.

The upper buffer layer may have a multilayer structure including a sub-upper buffer layer including a silicon nitride film.

The first storage capacitor electrode, the second storage capacitor electrode, and the third storage capacitor electrode may be formed of metal layers.

The first thin film transistor may include a first semiconductor pattern disposed on the lower buffer layer, the first gate electrode overlapping the first semiconductor pattern with a first gate-insulating layer interposed therebetween, and the first source electrode and the first drain electrode disposed on a plurality of inorganic insulating layers disposed on the first gate electrode, and the second thin film transistor may include a second semiconductor pattern disposed on the upper buffer layer, the second gate electrode overlapping the second semiconductor pattern with a second gate-insulating layer interposed therebetween, and the second source electrode and the second drain electrode disposed on an inorganic insulating layer disposed on the second gate electrode.

In another aspect of the present disclosure, an organic light-emitting display apparatus includes a substrate including a display region and a non-display region disposed around the display region, a lower buffer layer formed on the substrate, a first thin film transistor disposed in at least one of the display region or the non-display region, the first thin film transistor including a first semiconductor pattern, a first gate electrode, a first source electrode, and a first drain electrode formed on the lower buffer layer, an upper buffer layer disposed on the first semiconductor pattern, a second thin film transistor disposed on the upper buffer layer, the second thin film transistor including a second semiconductor pattern, a second gate electrode, a second source electrode, and a second drain electrode, a first light-blocking pattern disposed between the lower buffer layer and the second semiconductor pattern, the first light-blocking pattern overlapping the second semiconductor pattern, and a storage capacitor including a first storage capacitor electrode disposed between the first gate electrode and the first light-blocking pattern, a second storage capacitor electrode disposed on the same layer as the second gate electrode, and connected to the first storage capacitor electrode, and a third storage capacitor electrode disposed between the first storage capacitor electrode and the second storage capacitor electrode.

The first storage capacitor electrode, the second storage capacitor electrode, and the third storage capacitor electrode may be metal layers.

The second semiconductor pattern may be an oxide semiconductor pattern, and the second thin film transistor may be a driving TFT.

The first light-blocking pattern may be electrically connected to the second source electrode.

The first light-blocking pattern may be inserted into the upper buffer layer.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

The advantages and features of the present disclosure, and the method for achieving the advantages and features will become apparent with reference to embodiments described below in detail in conjunction with the accompanying drawings. However, the present disclosure is not limited to the embodiments disclosed below and may be implemented in a variety of different forms, and these embodiments allow the disclosure of the present invention to be complete and are merely provided to fully inform those of ordinary skill in the art to which the present disclosure belongs of the scope of the disclosure.

The shapes, sizes, proportions, angles, numbers, etc. disclosed in the drawings for describing the embodiments of the present disclosure are illustrative, and thus the present disclosure is not limited to the illustrated elements. The same reference symbol refers to the same element throughout the specification. In addition, in describing the present disclosure, when it is determined that a detailed description of a related known technology may unnecessarily obscure the subject matter of the present disclosure, such a detailed description will be omitted. When "including", "having", "comprising", etc. are used in this specification, other parts may also be present, unless "only" is used. When an element is expressed in the singular, the case including the plural is included unless otherwise explicitly stated.

In interpreting an element, it is to be interpreted as including an error range even when there is no separate explicit description thereof.

In the case of a description of a positional relationship, for example, when a positional relationship between two parts is described using "on", "above", "below", "next to", etc., one or more other parts may be located between the two parts, unless "immediately" or "directly" is used.

In the case of a description of a temporal relationship, for example, when a temporal relationship is described with "after", "subsequent to", "next", "before", etc., the discontinuous case may be included unless "immediately" or "directly" is used.

Although "first", "second", etc. are used to describe various elements, these elements are not limited by these terms. These terms are merely used to distinguish one element from another. Accordingly, a first element mentioned below may be a second element within the spirit of the present disclosure.

Respective features of the various embodiments of the present disclosure may be partially or wholly united or combined with each other, various types of interlocking and driving are technically possible, and the respective embodiments may be implemented independently of each other, or may be implemented together in an interrelated relationship.

Hereinafter, the present disclosure will be described in detail with reference to the accompanying drawings.

Figure 1:
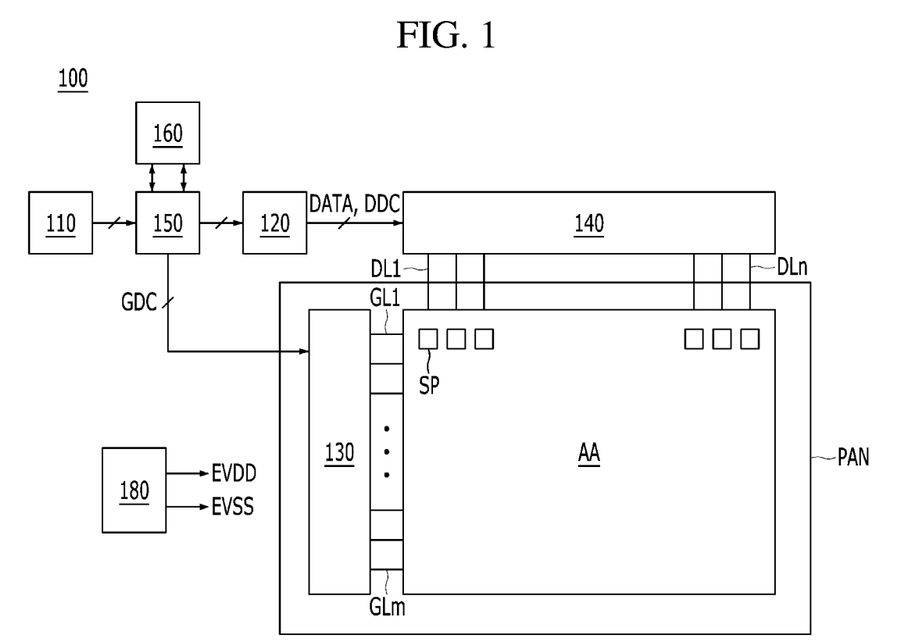
FIG. 1 is a schematic block diagram of an organic light-emitting display apparatus according to one embodiment of the present disclosure.
Figure 2:
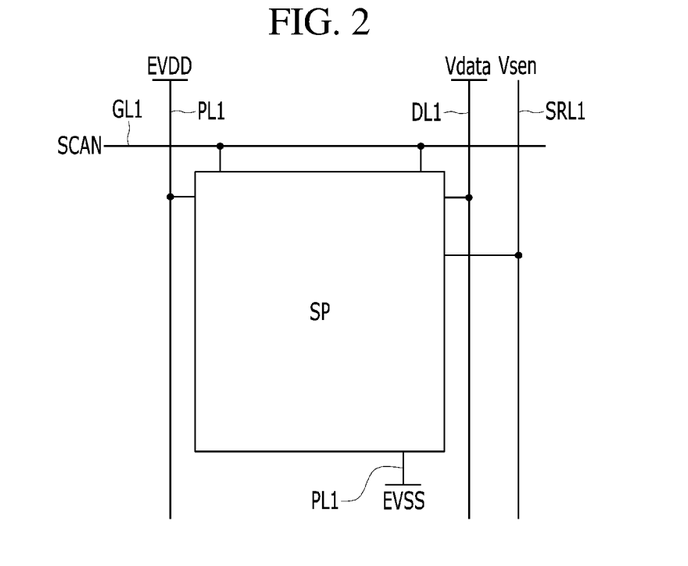
FIG. 2 is a schematic block diagram of a subpixel of the organic light-emitting display apparatus according to one embodiment of the present disclosure.

FIG. 1 is a schematic block diagram of an organic light-emitting display apparatus 100 according to the present disclosure, and FIG. 2 is a schematic block diagram of a subpixel SP illustrated in FIG. 1.

As illustrated in FIG. 1, the organic light-emitting display apparatus 100 includes an image-processing unit 110 (e.g., a circuit), a degradation compensator 150 (e.g., a circuit), a memory 160, a timing controller 120, a data driver 140, a power supply unit 180 (e.g., a circuit), and a display panel PAN in which a gate driver 130 is formed.

The image-processing unit 110 outputs a driving signal for driving various devices together with image data supplied from the outside. For example, the driving signal output from the image-processing unit 110 may include a data enable signal, a vertical synchronization signal, a horizontal synchronization signal, and a clock signal.

The degradation compensator 150 calculates a degradation compensation gain value of the subpixel SP of the display panel based on a sensing voltage Vsen supplied from the data driver 140, calculates a dimming weight value based on the calculated degradation compensation gain value, then modulates input image data Idata of each subpixel SP in a current frame by the calculated degradation compensation gain value and dimming weight value, and then supplies the modulated image data Idata to the timing controller 120.

The timing controller 120 is supplied with a driving signal, etc. along with the image data modulated by the deterioration compensator 150. The timing controller 120 generates and outputs a gate timing control signal GDC for controlling the operation timing of the gate driver 130 and a data timing control signal DDC for controlling the operation timing of the data driver 140 based on the driving signal input from the image-processing unit 110.

In addition, the timing controller 120 controls the operation timings of the gate driver 130 and the data driver 140 to acquire at least one sensing voltage Vsen from each subpixel SP and supplies the acquired sensing voltage Vsen to the degradation compensator 150.

The gate driver 130 outputs a scan signal to the display panel PAN in response to the gate timing control signal GDC supplied from the timing controller 120. The gate driver 130 outputs the scan signal through a plurality of gate lines GL1 to GLm. At this time, the gate driver 130 may take the form of an integrated circuit (IC). However, the present disclosure is not limited thereto. In particular, the gate driver 130 may have a gate-in-panel (GIP) structure formed by directly stacking a thin film transistor on a substrate inside the organic light-emitting display apparatus 100. The GIP may include a plurality of circuits such as a shift register and a level shifter.

The data driver 140 outputs a data voltage to the display panel PAN in response to the data timing control signal DDC input from the timing controller 120. The data driver 140 samples and latches a digital data signal DATA supplied from the timing controller 120 to convert the data signal into an analog data voltage based on a gamma voltage. The data driver 140 outputs the data voltage through a plurality of data lines DL1 to DLn.

In addition, the data driver 140 supplies the sensing voltage Vsen input from the display panel PAN to the deterioration compensator 150 through a sensing voltage readout line.

At this time, the data driver 140 may be mounted on the display panel PAN in the form of an integrated circuit (IC), and may be formed by stacking various patterns and layers directly on the display panel PAN. However, the disclosure is not limited thereto.

The power supply unit 180 outputs a high-potential driving voltage EVDD and a low-potential driving voltage EVSS and supplies the voltages to the display panel PAN. The high-potential driving voltage EVDD and the low-potential driving voltage EVSS are supplied to the display panel PAN through a power line. At this time, the voltages output from the power supply unit 180 may be output to the data driver 140 or the gate driver 130 and used for driving the driver.

The display panel PAN displays an image in response to the data voltage and the scan signal supplied from the data driver 140 and the gate driver 130, and the power supplied from the power supply unit 180.

The display panel PAN includes a plurality of subpixels SP so that an actual image is displayed. The subpixels SP include red subpixels, green subpixels and blue subpixels or include white (W) subpixels, red (R) subpixels, green (G) subpixels, and blue (B) subpixels. Here, the W, R, G, and B subpixels SP may all have the same area, or may have different areas.

The memory 160 stores a lookup table for the deterioration compensation gain and stores a deterioration compensation time of an organic light-emitting of the subpixel SP. At this time, the deterioration compensation time of the organic light-emitting may be the number of driving operations or the driving time of an organic electroluminescent display panel.

As illustrated in FIG. 2, one subpixel SP may be connected to a gate line GL1, a data line DL1, a sensing voltage readout line SRL1, and a power line PL1. The number of transistors and capacitors and a driving method of the subpixel SP are determined according to a circuit configuration.

Figure 3:
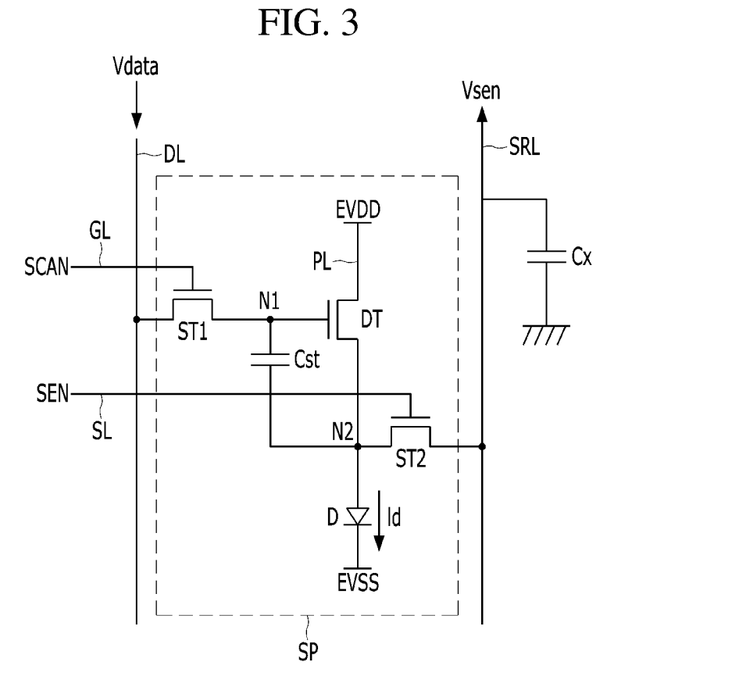
FIG. 3 is a circuit diagram of the subpixel of the organic light-emitting display apparatus according to one embodiment of the present disclosure.

FIG. 3 is a circuit diagram illustrating the subpixel SP of the organic light-emitting display apparatus 100 according to the present disclosure.

As illustrated in FIG. 3, the organic light-emitting display apparatus 100 according to the present disclosure includes a gate line GL, a data line DL, a power line PL, and a sensing line SL, which intersect each other to define the subpixel SP, and the subpixel SP includes a driving thin film transistor DT, an organic light-emitting D, a storage capacitor Cst, a first switch thin film transistor ST, and a second switch thin film transistor ST2.

The organic light-emitting D includes an anode electrode connected to a second node N2, a cathode electrode connected to an input terminal of the low-potential driving voltage EVSS, and an organic light-emitting layer positioned between the anode electrode and the cathode electrode.

The driving thin film transistor DT controls a current Id flowing through the organic light-emitting D according to a gate-source voltage Vgs. The driving thin film transistor DT includes a gate electrode connected to a first node N1, a drain electrode connected to the power line PL to provide the high-potential driving voltage EVDD, and a source electrode connected to the second node N2.

The storage capacitor Cst is connected between the first node N1 and the second node N2.

When the display panel PAN is driven, a first switch thin film transistor ST1 applies a data voltage Vdata, with which the data line DL is charged, to the first node N1 in response to a gate signal SCAN to turn ON the driving thin film transistor DT. Here, the first switch thin film transistor ST1 includes a gate electrode connected to the gate line GL to receive a scan signal SCAN, a drain electrode connected to the data line DL to receive the data voltage Vdata, and a source electrode connected to the first node N1.

The second switch thin film transistor ST2 switches a current between the second node N2 and the sensing voltage readout line SRL in response to the sensing signal SEN, thereby storing a source voltage of the second node N2 in a sensing capacitor Cx of the sensing voltage readout line SRL. When the display panel PAN is driven, the second switch thin film transistor ST2 switches a current between the second node N2 and the sensing voltage readout line SRL in response to the sensing signal SEN, thereby resetting a source voltage of the driving thin film transistor DT to an initialization voltage Vpre. At this time, in the second switch thin film transistor ST2, a gate electrode is connected to the sensing line SL, a drain electrode is connected to the second node N2, and a source electrode is connected to the sensing voltage readout line SRL.

Meanwhile, in the drawings, an organic light-emitting display apparatus having a 3T1C structure including three TFTs and one storage capacitor has been illustrated and described. However, the organic light-emitting display apparatus of the present disclosure is not limited to this structure, and may be applied to various structures, such as 4T1C, 5T1C, 6T1C, 7T1C, and 8T1C.

As such, the TFTs disposed in the GIP structure and the TFTs disposed in the subpixel have different functions, and thus need to have different operating characteristics. In more detail, in the GIP circuit part, a high-speed operation characteristic is necessary, and in the subpixel, there may be a need for a driving thin film transistor that requires rich grayscale expression even in low-speed operation depending on the function, and there may be a need for a switching element that has fast operation characteristics and effectively blocks leakage current in an OFF state.

Accordingly, in the organic light-emitting display apparatus according to the present disclosure, it is intended to provide a thin film transistor optimized for each function.

Figure 4:
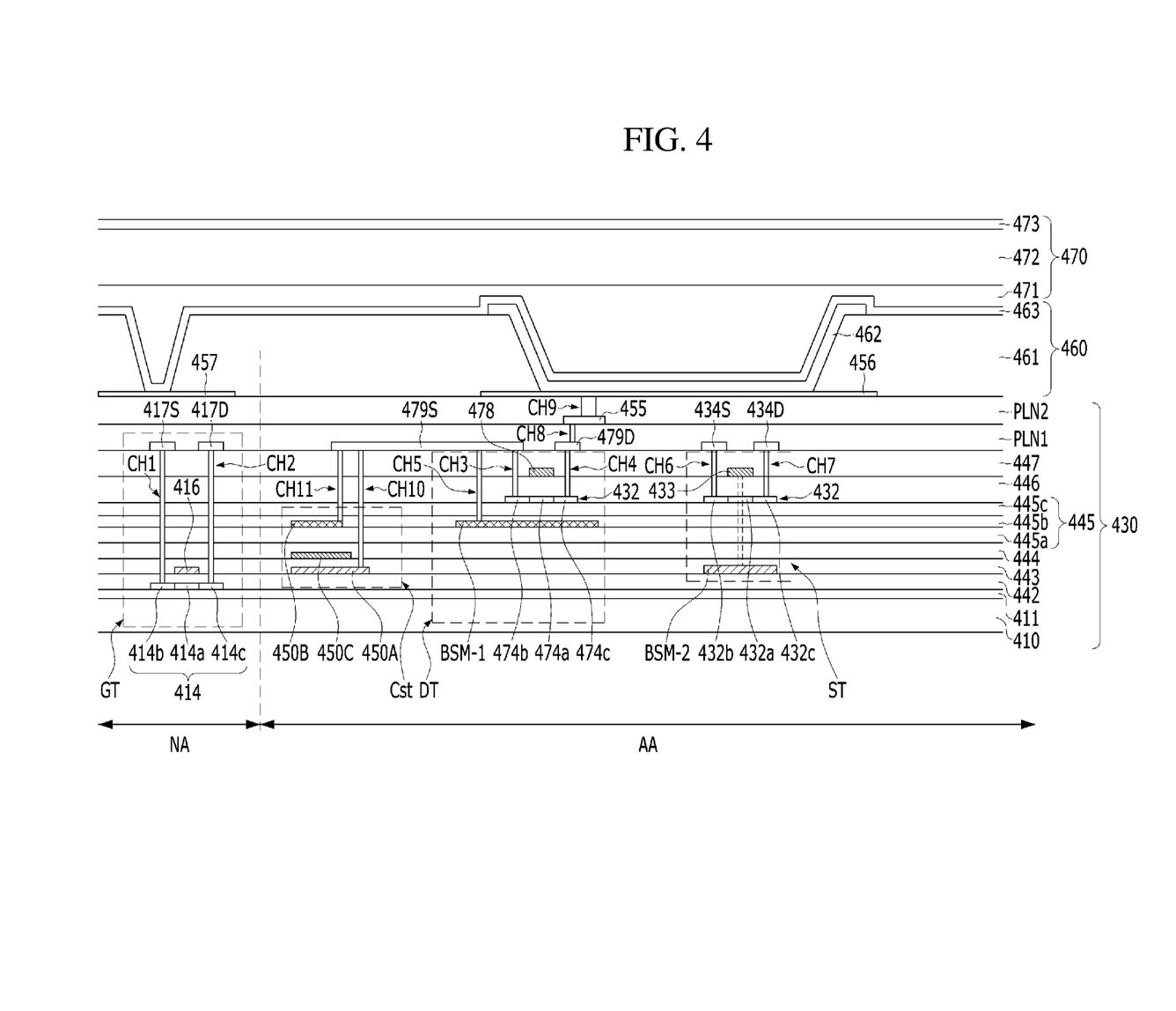
FIG. 4 is a cross-sectional view of one thin film transistor disposed in a gate-driving circuit part of a non-display region, and a driving TFT, a switching TFT, and a storage capacitor disposed in a display region according to a first embodiment of the present disclosure.

FIG. 4 is a cross-sectional view illustrating one first thin film transistor GT as a representative of TFTs disposed in the non-display region NA, particularly a GIP region, a driving thin film transistor DT disposed in a subpixel of a display region AA to drive the organic electroluminescent element, a first switching thin film transistor ST, and the storage capacitor Cst.

As illustrated in FIG. 4, the driving thin film transistor DT and the first switching thin film transistor ST are disposed in a subpixel on a substrate 410. At this time, although FIG. 4 illustrates the driving thin film transistor DT and one switching thin film transistor ST, this disclosure is for convenience of description, and a plurality of switching TFTs may actually be disposed on the substrate 410.

In addition, a plurality of first TFTs GT included in the gate-driving circuit part may be disposed in the non-display region NA of the substrate 410.

The first thin film transistor GT includes a first polycrystalline semiconductor pattern 414 disposed on a lower buffer layer 411 formed on the substrate 410, a first gate-insulating layer 442 insulating the first polycrystalline semiconductor pattern 414, a first gate electrode 416 disposed on the first gate-insulating layer 442 to overlap the first polycrystalline semiconductor pattern 414, a plurality of insulating layers formed on the first gate electrode 416, a first source electrode 417S disposed on the plurality of insulating layers, and a first drain electrode 417D.

The substrate 410 may be configured as a multilayer substrate in which an organic layer and an inorganic layer are alternately stacked. For example, the substrate 410 may be formed by alternately stacking an organic layer such as polyimide and an inorganic layer such as silicon oxide ($SiO_2$).

The lower buffer layer 411 is formed on the substrate 410. The lower buffer layer 411 serves to block or at least reduce moisture, etc. that may enter from the outside, and a silicon oxide ($SiO_2$) film may be stacked in multiple layers and used as the lower buffer layer 411.

The first polycrystalline semiconductor pattern 414 is formed on the lower buffer layer 411. The first polycrystalline semiconductor pattern 414 is made of a polycrystalline semiconductor, and includes a first channel region 414a through which charges move, and a first source region 414b and a first drain region 414c adjacent to the first channel region 414a with the first channel region 414a interposed therebetween. The first source region 414b and the first drain region 414c are conductive regions obtained by doping an intrinsic polycrystalline semiconductor pattern with impurity ions such as phosphorus (P) or boron (B).

The first polycrystalline semiconductor pattern 414 includes the first channel region 414a, and the first source region 414b and the first drain region 414c adjacent to the first channel region 414a with the first channel region 414a interposed therebetween.

The first gate-insulating layer 442 is formed by depositing an inorganic insulating layer such as silicon oxide ($SiO_2$) on the entire surface of the substrate 410 on which the first polycrystalline semiconductor pattern 414 is formed. The first gate-insulating layer 442 protects and insulates the first polycrystalline semiconductor pattern 414 from the outside.

The first gate electrode 416 may be made of a metal material. For example, the first gate electrode 416 may have a single layer or multiple layers made of any one or an alloy of molybdenum (Mo), aluminum (Al), chromium (Cr), gold (Au), titanium (Ti), nickel (Ni), neodymium (Nd), and copper (Cu). However, the disclosure is not limited thereto.

The first gate electrode 416 is disposed on the first gate-insulating layer 442 to overlap the first channel region 414a.

A plurality of insulating layers may be interposed between the first gate electrode 416, and the first source electrode 417S and the first drain electrode 417D.

Referring to FIG. 4, the plurality of insulating layers may be a first interlayer insulating layer 443 in contact with an upper surface of the first gate electrode 416, and a second interlayer insulating layer 455, an upper buffer layer 445, a second gate-insulating layer 446, and a third interlayer insulating layer 447 sequentially stacked thereon.

The first source electrode 417S and the first drain electrode 417D are disposed on the third interlayer insulating layer 447. The first source electrode 417S and the first drain electrode 417D are connected to the first source region 414b and the first drain region 414c through a first contact hole CH1 and a second contact hole CH2, respectively, penetrating the first gate-insulating layer 442, the first interlayer insulating layer 443, the second interlayer insulating layer 444, the upper buffer layer 445, the second gate-insulating layer 446, and the third interlayer insulating layer 447.

Meanwhile, the driving thin film transistor DT, the first switching thin film transistor ST, and the storage capacitor Cst are disposed in the subpixel of the display region AA.

The driving thin film transistor DT is formed on the upper buffer layer 445.

In an embodiment of the present disclosure, the driving thin film transistor DT includes a first oxide semiconductor pattern 474, a second gate electrode 478 overlapping the first oxide semiconductor pattern 474, a second source electrode 479S, and a second drain electrode 479D.

An oxide semiconductor material may be made of an oxide of a metal such as zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. More specifically, the oxide semiconductor material may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc.

Conventionally, for a driving TFT, a polycrystalline semiconductor pattern advantageous for high-speed operation has been used as an active layer. However, the driving thin film transistor including the polycrystalline semiconductor pattern has a major problem in that, in an OFF state, leakage current is generated and power is consumed. In particular, the problem of power consumption in the OFF state becomes more problematic when a display device operates at a low speed, for example, in the case of a still image displaying a document screen. Accordingly, the embodiment of the present disclosure proposes a driving thin film transistor using an oxide semiconductor pattern, which is advantageous for blocking leakage current, as an active layer.

However, in the case of a thin film transistor using an oxide semiconductor pattern as an active layer, a current fluctuation value with respect to a unit voltage fluctuation value is large due to the material characteristics of an oxide semiconductor, and thus defects frequently occur in a low-gray level region where precise current control is required. Accordingly, the embodiment of the present disclosure provides a driving thin film transistor in which a fluctuation value of a current in an active layer is relatively insensitive to a fluctuation value of a voltage applied to a gate electrode. That is, it is necessary to increase an S-factor value of the driving TFT.

For reference, an S-factor is commonly referred to as a "subthreshold slope" and represents a voltage that is required to increase a current tenfold. In a graph (I-V curve) representing a characteristic of a drain current with respect to a gate voltage, the S-factor is an inverse value of a slope of the graph in a region below a threshold voltage.

A small S-factor means that the slope of the characteristic graph (I-V) of the drain current with respect to the gate voltage is large, and thus allows the thin film transistor to be turned ON even by a small voltage. Accordingly, the switching characteristics of the thin film transistor are improved. On the other hand, since the threshold voltage is reached in a short time, it is difficult to express sufficient grayscale.

A large S-factor means that the slope of the characteristic graph (I-V) of the drain current with respect to the gate voltage is small, and thus causes a decrease in an ON/FF reaction speed of the TFT. Accordingly, the switching characteristics of the thin film transistor deteriorate. However, since the threshold voltage is reached over a relatively long period of time, sufficient grayscale expression is possible.

The driving thin film transistor DT further includes a first light-blocking pattern BSM-1 disposed inside the upper buffer layer 445 and overlapping the first oxide semiconductor pattern 474.

Substantially, the first light-blocking pattern BSM-1 is inserted into the upper buffer layer 445. However, the form in which the first light-blocking pattern BSM-1 is disposed inside the upper buffer layer 445 will be described in more detail by reflecting the process characteristics. The first light-blocking pattern BSM-1 may be formed on a first sub-upper buffer layer 445a disposed on the second interlayer insulating layer 444. Further, the second sub-upper buffer layer 445b completely covers the first light-blocking pattern BSM-1 from the top, and the third sub-upper buffer layer 445c is formed on the second sub-upper buffer layer 445b.

That is, the upper buffer layer 445 has a structure in which the first sub-upper buffer layer 445a, the second sub-upper buffer layer 445b, and the third sub-upper buffer layer 445c are sequentially stacked.

The first sub-upper buffer layer 445a and the third sub-upper buffer layer 445c may be formed of a silicon oxide ($SiO_2$) film.

The first sub-upper buffer layer 445a and the third sub-upper buffer layer 445c may be formed of a silicon oxide ($SiO_2$) film that does not include hydrogen particles, thereby contributing as a basis for a driving thin film transistor DT using an oxide semiconductor pattern, the reliability of which may be impaired by hydrogen particles, as an active layer.

Meanwhile, the second sub-upper buffer layer 445b may be formed of a silicon nitride (SiNx) film having excellent ability to trap hydrogen particles. The second sub-upper buffer layer 445b covers both an upper surface and a side surface of the first light-blocking pattern BSM-1 to completely seal the first light-blocking pattern BSM-1. The silicon nitride (SiNx) film has a better ability to trap hydrogen particles than the silicon oxide ($SiO_2$) film.

That is, the first interlayer insulating layer 443 including hydrogen particles is positioned below the upper buffer layer 445, and hydrogen particles generated during a hydrogenation process of the first thin film transistor GT, which uses a polycrystalline semiconductor pattern as an active layer, may pass through the upper buffer layer 445 and impair reliability of the oxide semiconductor pattern positioned on the upper buffer layer 445. That is, when the hydrogen particles penetrate the oxide semiconductor pattern, there may be problem that TFTs using the oxide semiconductor pattern as an active layer have different threshold voltages or different channel conductivity depending on the formation positions thereof. In particular, in the case of the driving thin film transistor DT, it is important to ensure reliability, which directly contributes to an operation of a light-emitting element.

Accordingly, in the embodiment of the present disclosure, by forming the second sub-upper buffer layer 445b that completely covers the first light-blocking pattern BSM-1, it is possible to prevent or at least reduce damage to the reliability of the driving thin film transistor DT due to the hydrogen particles.

In addition, in the embodiment of the present disclosure, the first light-blocking pattern BSM-1 may be formed on a metal layer including a titanium (Ti) material having excellent ability to trap hydrogen particles. For example, the metal layer may be a single layer of titanium, multiple layers of molybdenum (Mo) and titanium (Ti), or an alloy of molybdenum (Mo) and titanium (Ti). However, the present disclosure is not limited thereto, and other metal layers including titanium (Ti) may be adopted.

Titanium (Ti) traps hydrogen particles diffusing in the upper buffer layer 445 to prevent the hydrogen particles from reaching the first oxide semiconductor pattern 474. Therefore, in the driving thin film transistor DT according to the embodiment of the present disclosure, the first light-blocking pattern BSM-1 is formed with a metal layer such as titanium, having ability to trap hydrogen particles, and the first light-blocking pattern BSM-1 is covered with a silicon nitride (SiNx) film, having the ability to trap hydrogen particles, thereby relieving the problem in which the reliability of the oxide semiconductor pattern is impaired by the hydrogen particles.

Meanwhile, the second sub-upper buffer layer 445b including silicon nitride (SiNx) is not deposited on the entire surface of the display region unlike the first sub-upper buffer layer 445a, and may be deposited only on a portion of an upper surface of the first sub-upper buffer layer 445a so as to be able to selectively cover only the first light-blocking pattern BSM-1. The second sub-upper buffer layer 445b is formed of a material different from that of the first sub-upper buffer layer 445a, that is, a silicon nitride (SiNx) film. Thus, when the second sub-upper buffer layer 445b is deposited on the entire surface of the display region, film lifting may occur. To address this problem, the second sub-upper buffer layer 445b may be selectively formed only at a position where the first light-blocking pattern BSM-1 necessary for a function thereof is formed.

In one embodiment, the first light-blocking pattern BSM-1 is formed below the first oxide semiconductor pattern 474 to completely cover the first oxide semiconductor pattern 474 when viewed from below.

In addition, the first oxide semiconductor pattern 474, which is an active layer, includes a second channel region 474a through which charges move, and a second source region 474b and a second drain region 474c adjacent to the second channel region 474a with the second channel region 474a interposed therebetween.

The second channel region 474a may be formed of an intrinsic oxide semiconductor that is not doped with impurities. In addition, the second source region 474b and the second drain region 474c may be conductive regions obtained by doping the intrinsic oxide semiconductor with group 3 or group 5 impurity ions.

Meanwhile, the second source electrode 479S of the driving thin film transistor DT may be electrically connected to the first light-blocking pattern BSM-1.

As described above, when the first light-blocking pattern BSM-1 is disposed inside the upper buffer layer 445, and the second source electrode 479S is electrically connected to the first light-blocking pattern BSM-1, the following additional effect may be obtained.

This effect will be described in detail with reference to FIGS. 9A and 9B.

Figure 9A:
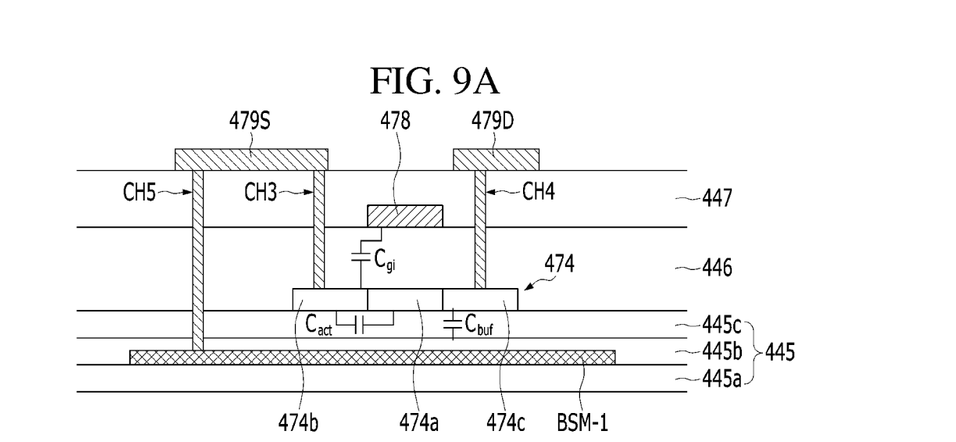
FIGS. 9A and 9B are a cross-sectional view and a circuit diagram illustrating the relationship between parasitic capacitances generated inside the driving thin film transistor according to one embodiment of the present disclosure.
Figure 9B:
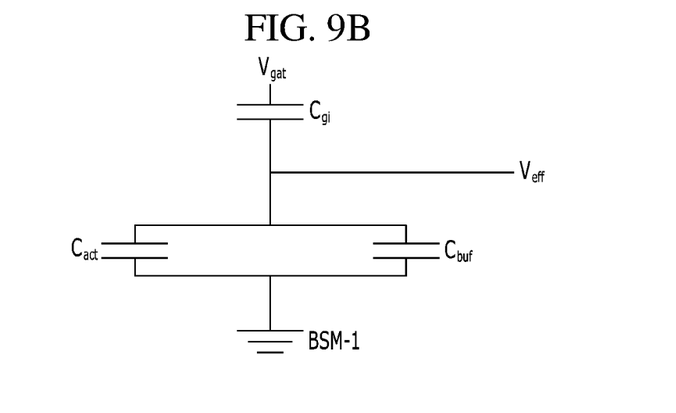

FIG. 9A is a cross-sectional view separately illustrating only the driving thin film transistor of FIG. 4 according to one embodiment. FIG. 9B is a circuit diagram illustrating the relationship between a parasitic capacitance generated in the driving thin film transistor and a voltage applied thereto according to one embodiment.

Referring to FIG. 9A, in the first oxide semiconductor pattern 474, since the second source region 474b and the second drain region 474c are doped with impurities, a parasitic capacitance $C_{act}$ is generated inside the first oxide semiconductor pattern 474, a parasitic capacitance $C_{gi}$ is generated between the second gate electrode 478 and the first oxide semiconductor pattern 474, and a parasitic capacitance $C_{buf}$ is generated between the first light-blocking pattern BSM-1, which is electrically connected to the second source electrode 479S, and the first oxide semiconductor pattern 474.

The first oxide semiconductor pattern 474 and the first light-blocking pattern BSM-1 are electrically connected to each other through the second source electrode 479S, and thus the parasitic capacitance $C_{act}$ and the parasitic capacitance $C_{buf}$ are connected to each other in parallel, and the parasitic capacitance $C_{act}$ and the parasitic capacitance $C_{gi}$ are connected in series. In addition, when a gate voltage of $V_{gat}$ is applied to the second gate electrode 478, the effective voltage $V_{eff}$ that is actually applied to the first oxide semiconductor pattern 474 satisfies the following equation.

$$\Delta V = C_{gi}/(C_{gi}+C_{act}\times C_{buf})\times \Delta V_{gat}$$

Accordingly, the effective voltage applied to the channel of the first oxide semiconductor pattern 474 is in inverse proportion to the parasitic capacitance $C_{buf}$, and thus the effective voltage applied to the first oxide semiconductor pattern 474 may be adjusted by adjusting the parasitic capacitance $C_{buf}$.

That is, when the first light-blocking pattern BSM-1 is disposed close to the first oxide semiconductor pattern 474 to increase the parasitic capacitance $C_{buf}$, the actual value of the current flowing through the first oxide semiconductor pattern 474 may be reduced.

The reduction in the effective value of the current flowing through the first oxide semiconductor pattern 474 means that a control range of the driving thin film transistor DT, which may be controlled using the voltage $V_{gat}$ actually applied to the second gate electrode 478, is widened.

Accordingly, in the embodiment of the present disclosure, the first light-blocking pattern BSM-1 is disposed closer to the first oxide semiconductor pattern 474 to expand the range in which the driving thin film transistor DT controls the grayscale. As a result, it is possible to precisely control the light-emitting element even at low gray levels, which may solve a problem of screen unevenness that frequently occurs at low gray levels.

Meanwhile, referring to FIG. 4, the subpixel includes the first switching thin film transistor ST including the oxide semiconductor pattern. The first switching thin film transistor ST may be disposed between a data wiring and the driving thin film transistor DT. Even though one switching thin film transistor is illustrated in FIG. 4, one or more switching thin film transistor may be disposed in the subpixel. That is, one or more switching TFTs may be disposed according to various configurations of the pixel circuit in the subpixel, such as 3T1C, 4T1C, 5T1C, 6T1C, and 7T1C.

The first switching thin film transistor ST includes a second oxide semiconductor pattern 432, a third gate electrode 433, a third source electrode 434S, and a third drain electrode 434D.

The second oxide semiconductor pattern 432 includes a third channel region 432*a*, and a third source region 432*b* and a third drain region 432*c* adjacent to the third channel region 432*a* with the third channel region interposed therebetween.

The third gate electrode 433 is positioned on the second oxide semiconductor pattern 432 with the second gate-insulating layer 446 interposed therebetween.

The third source electrode 434S and the third drain electrode 434D are positioned on the third gate electrode 433 with the third interlayer insulating layer 447 interposed therebetween.

The third source electrode 434S and the third drain electrode 434D are connected to the third source region 432*b* and the third drain region 432*c* through a sixth contact hole CH6 and a seventh contact hole CH7, respectively, penetrating the second gate-insulating layer 446 and the third interlayer insulating layer 447.

In addition, a second light-blocking pattern BSM-2 may be disposed below the second oxide semiconductor pattern 432.

To protect the second oxide semiconductor pattern 432 from light entering from the outside, the second light-blocking pattern BSM-2 may overlap the second oxide semiconductor pattern 432, and may be located below the second oxide semiconductor pattern 432.

The second light-blocking pattern BSM-2 may be formed on the first gate-insulating layer 442. However, since the second light-blocking pattern BSM-2 may reduce an S-factor value of the second oxide semiconductor pattern 432, in another embodiment, the second light-blocking pattern BSM-2 may not be disposed below the second oxide semiconductor pattern 432.

However, when the second light-blocking pattern BSM-2, which is the first embodiment, is disposed below the second oxide semiconductor pattern 432, the second light-blocking pattern BSM-2 may be disposed on a lower layer than that of the first light-blocking pattern BSM-1. That is, the second light-blocking pattern BSM-2 may be disposed on a lower layer than that of the first light-blocking pattern BSM-1 so that a distance between the second oxide semiconductor pattern 432 and the second light-blocking pattern BSM-2 is longer than a distance between the first light-blocking pattern BSM-1 and the first oxide semiconductor pattern 474. By disposing the second light-blocking pattern BSM-2 below the second oxide semiconductor pattern 432 and on a lower layer than that of the first light-blocking pattern BSM-1, it is possible to implement a first switching thin film transistor ST requiring a high-speed operation characteristic. Naturally, it is possible that the first switching thin film transistor ST does not include the second light-blocking pattern BSM-2.

Meanwhile, referring to FIG. 4, the subpixel further includes the storage capacitor Cst.

The storage capacitor Cst stores a data voltage applied through the data line for a certain period of time and provides the data voltage to the organic electroluminescent element. Accordingly, as the value of the storage capacitor increases, the data voltage may be more stably provided to the organic electroluminescent element.

In the first embodiment of the present disclosure with reference to FIG. 4, the storage capacitor Cst may have a configuration in which at least two sub-storage capacitors are connected in parallel. Capacitors may increase the capacitance of the capacitor through parallel connection.

A first electrode 450A of the storage capacitor may be formed as the same metal layer as the first gate electrode 416 on the same layer as the first gate electrode 416.

In addition, a second electrode 450B of the storage capacitor may be formed as the same metal layer as the first light-blocking pattern BSM-1 on the same layer as the first light-blocking pattern BSM-1. The first electrode 450A of the storage capacitor and the second electrode 450B of the storage capacitor are electrically connected to each other.

Meanwhile, a third electrode 450C of the storage capacitor, which may be an additional storage capacitor electrode, may be disposed between the first electrode 450A of the storage capacitor and the second electrode 450B of the storage capacitor.

The third electrode 450C of the storage capacitor is a metal layer separate from the first electrode 450A of the storage capacitor and the second electrode 450B of the storage capacitor. Therefore, the third electrode 450C of the storage capacitor is disposed on the first interlayer insulating layer 443 covering the first electrode 450A of the storage capacitor while overlapping the first electrode 450A of the storage capacitor.

As a result, a first sub-storage capacitor is formed between the first electrode 450A of the storage capacitor and the third electrode 450C of the storage capacitor, and a second sub-storage capacitor is formed between the second electrode 450B of the storage capacitor and the third electrode 450C of the storage capacitor, thereby having a configuration in which these two sub-storage capacitors are connected to each other in parallel.

The first electrode 450A of the storage capacitor, the second electrode 450B of the storage capacitor, and the third electrode 450C of the storage capacitor may all be formed of metal electrodes, thereby increasing the capacitor capacity.

Meanwhile, the first gate electrode 416 and the first electrode 450A of the storage capacitor may be simultaneously formed of the same material on the first gate-insulating layer 442. That is, since the electrodes are formed through a single mask process, the use of a mask may be reduced and the process may be simplified.

In addition, the first light-blocking pattern BSM-1 and the second electrode 450B of the storage capacitor may be simultaneously formed of the same metal layer on the first sub-upper buffer layer 445*a*. That is, since the pattern and the electrode are formed through a single mask process, the use of a mask may be reduced and the process may be simplified.

The first electrode 450A of the storage capacitor and the second electrode 450B of the storage capacitor may be electrically connected to each other by being connected to the second source electrode 479S through a tenth contact hole CH10 and an eleventh contact hole CH11, respectively.

Figure 5:
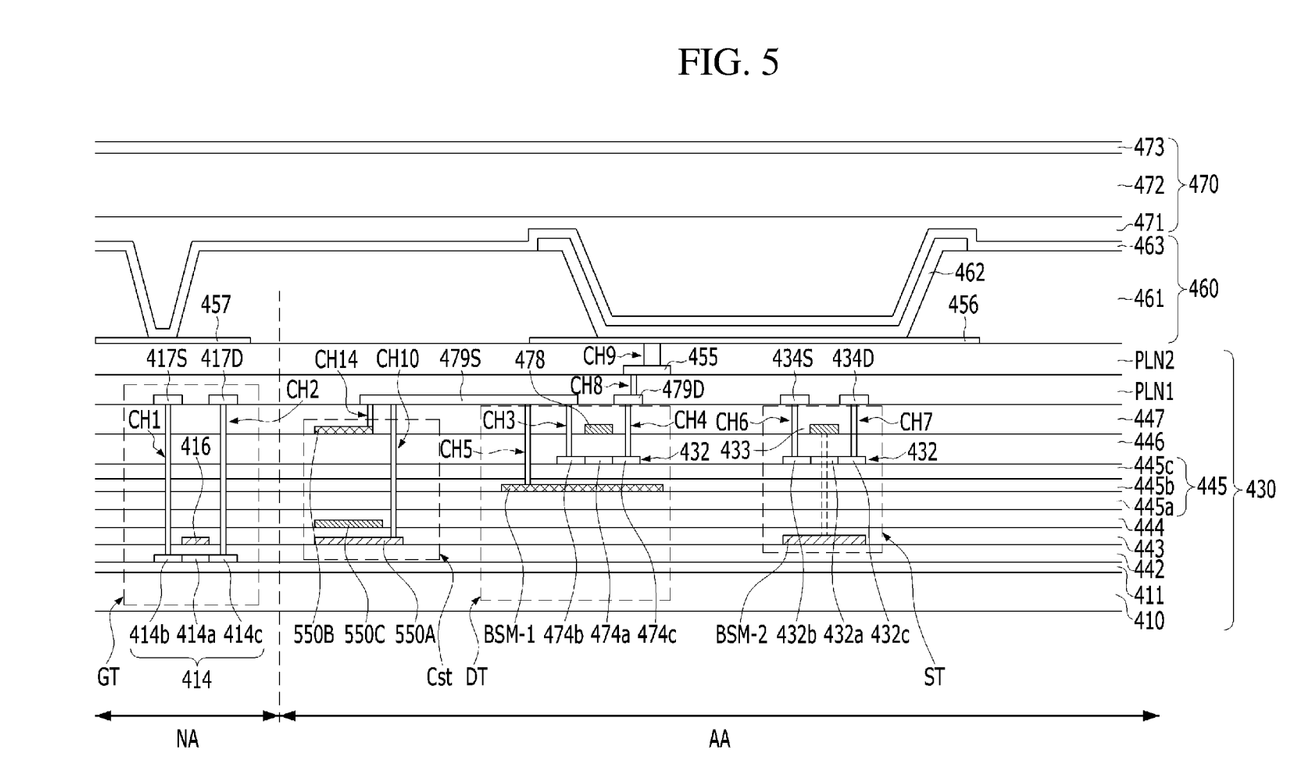
FIG. 5 is a cross-sectional view of one thin film transistor disposed in a gate-driving circuit part of a non-display region, and a driving TFT, a switching TFT, and a storage capacitor disposed in a display region according to a second embodiment of the present disclosure.

Meanwhile, an organic light-emitting display apparatus including a storage capacitor Cst as a second embodiment of the present disclosure will be described with reference to FIG. 5. The second embodiment has the same configuration as that of the first embodiment except that the storage capacitor Cst has a different configuration from that of the first embodiment.

In the second embodiment, in the storage capacitor Cst, a second electrode 550B of the storage capacitor is formed of the same material as that of the second gate electrode 478 on the same layer as the second gate electrode 478.

In addition, a first electrode 550A of the storage capacitor is formed of the same material as that of the first gate electrode 416 on the same layer as the first gate electrode 416. A third electrode 550C of the storage capacitor is disposed between the first light-blocking pattern BSM-1 and the first gate electrode 416 and may be an additional metal layer.

The third electrode 550C of the storage capacitor is disposed on the first interlayer insulating layer 443 covering the first electrode 550A of the storage capacitor while overlapping the first electrode 550A of the storage capacitor.

In addition, the first electrode 550A of the storage capacitor and the second electrode 550B of the storage capacitor are electrically connected to each other by being respectively connected to the second source electrode 479S.

As a result, a first sub-storage capacitor is formed between the first electrode 550A of the storage capacitor and the third electrode 550C of the storage capacitor, and a second sub-storage capacitor is formed between the second electrode 550B of the storage capacitor and the third electrode 550C of the storage capacitor, thereby having a configuration in which these two sub-storage capacitors are connected to each other in parallel.

Figure 6:
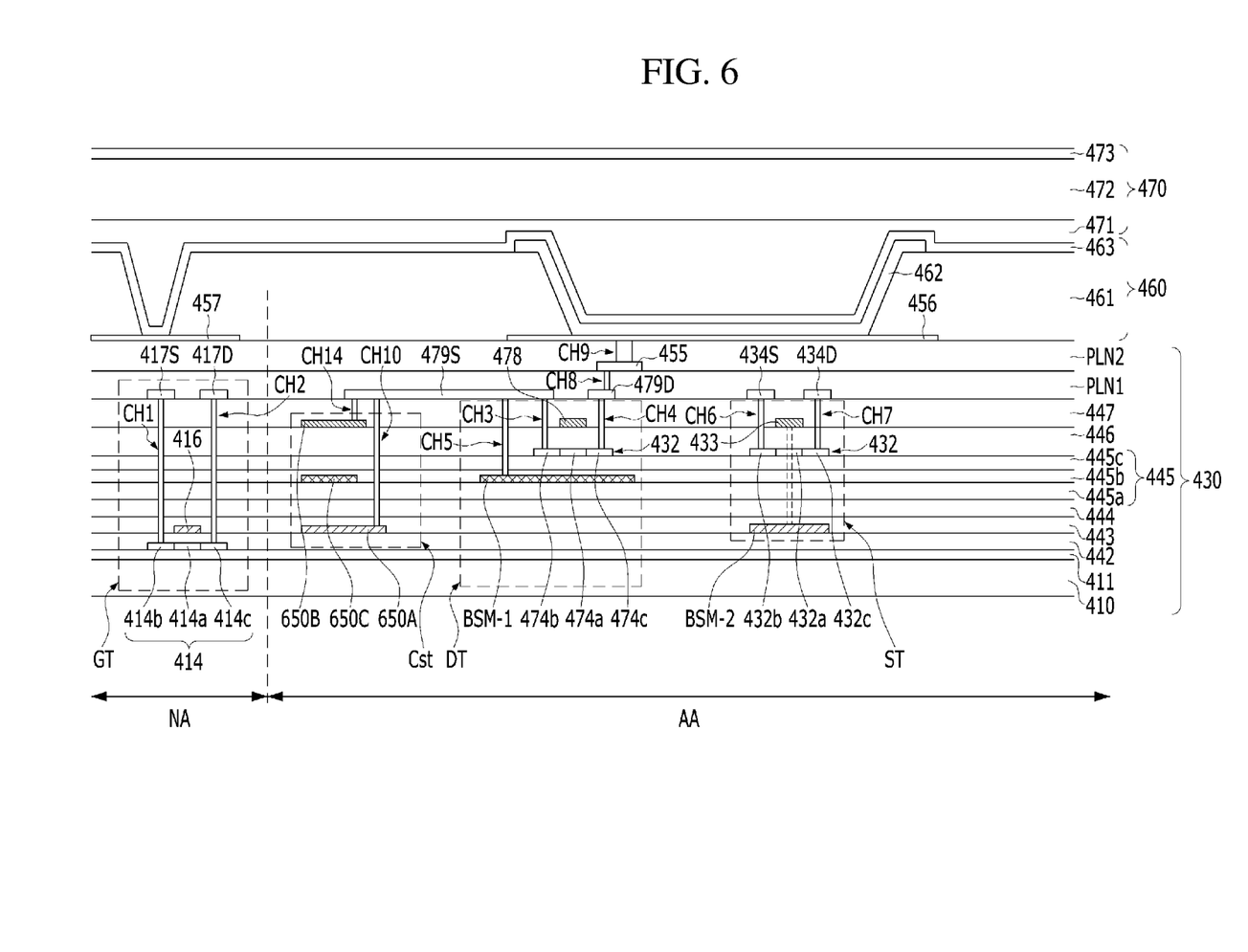
FIG. 6 is a cross-sectional view of one thin film transistor disposed in a gate-driving circuit part of a non-display region, and a driving TFT, a switching TFT, and a storage capacitor disposed in a display region according to a third embodiment of the present disclosure.

Meanwhile, an organic light-emitting display apparatus including a storage capacitor Cst as a third embodiment of the present disclosure will be described with reference to FIG. 6. The third embodiment has the same configuration as that of the first embodiment except that the storage capacitor Cst has a different configuration from that of the first embodiment.

In the third embodiment, the storage capacitor Cst uses basic layers included in the subpixel without adding a separate metal layer for the third electrode 550C of the storage capacitor.

In the third embodiment, a first electrode 650A of the storage capacitor is formed as the same metal layer as the first gate electrode 416 on the same layer as the first gate electrode 416. That is, the first electrode 650A of the storage capacitor is formed as the same metal layer as the metal layer included in the first gate electrode 416 on the first gate-insulating layer 443.

In addition, a second electrode 650B of the storage capacitor is formed as the same metal layer as the second gate electrode 478 on the same layer as the second gate electrode 478. Further, the first electrode 550A of the storage capacitor and the second electrode 550B of the storage capacitor are electrically connected to each other by being respectively connected to the second source electrode 479S.

In addition, a third electrode 650C of the storage capacitor is formed as the same metal layer as the first light-blocking pattern BSM-1 on the same layer as the first light-blocking pattern BSM-1. The third electrode 650C of the storage capacitor overlaps the first electrode 650A of the storage capacitor and the second electrode 650B of the storage capacitor, respectively, to constitute the sub-storage capacitor.

In the third embodiment, when forming the first gate electrode 416, the first light-blocking pattern BSM-1, and the second gate electrode 478, which are essential for configuring the subpixel of the present disclosure, by forming the first electrode 650A of the storage capacitor, the third electrode 650C of the storage capacitor, and the second electrode 650B of the storage capacitor, respectively, there is no need to add a separate metal layer for the storage capacitor configuration.

Figure 7:
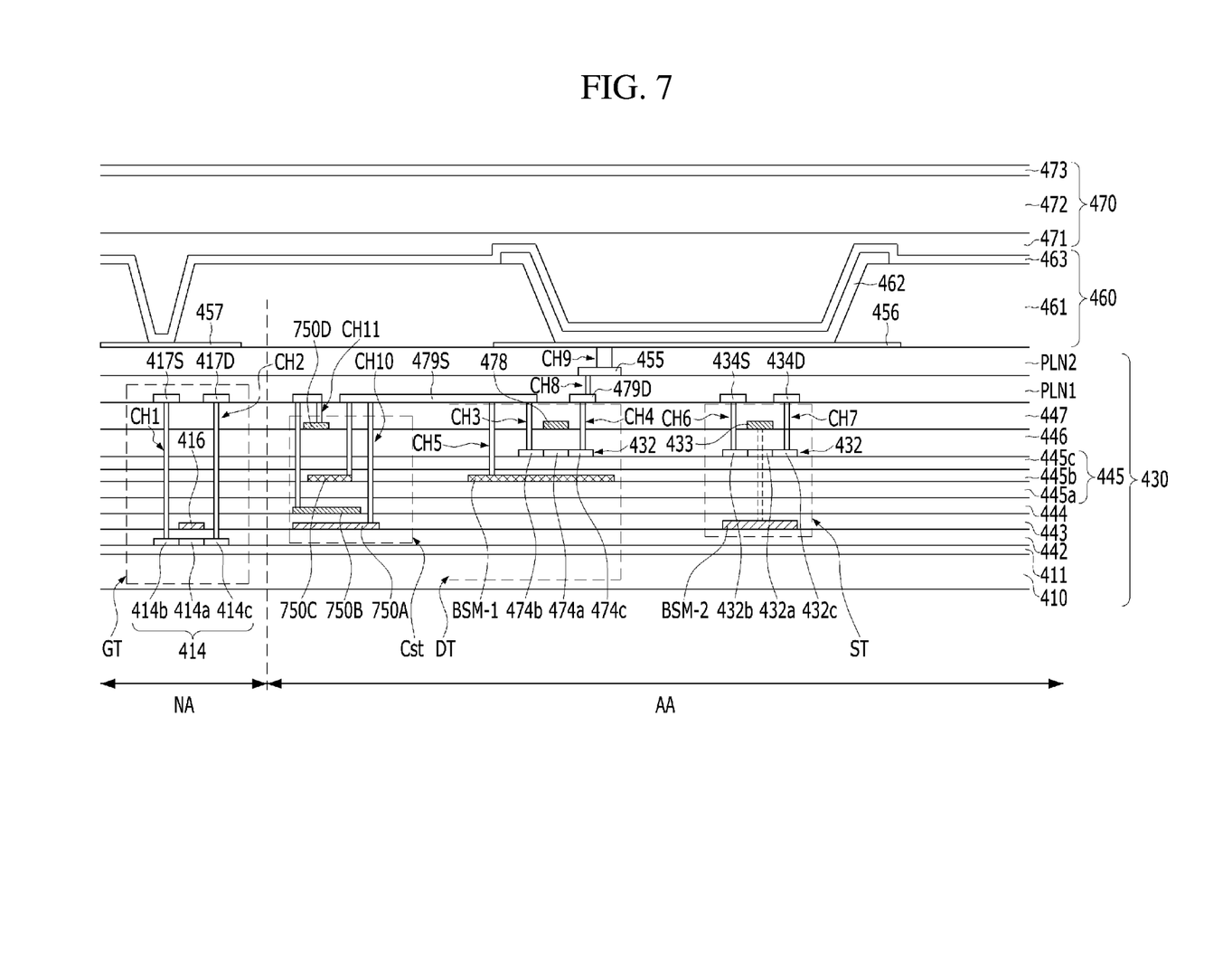
FIG. 7 is a cross-sectional view of one thin film transistor disposed in a gate-driving circuit part of a non-display region, and a driving TFT, a switching TFT, and a storage capacitor disposed in a display region according to a fourth embodiment of the present disclosure.

An organic light-emitting display apparatus will be described as a fourth embodiment of the present disclosure with reference to FIG. 7.

The fourth embodiment has the same configuration as that of the first embodiment except that the storage capacitor Cst has a different configuration from that of the first embodiment.

In the fourth embodiment, the storage capacitor Cst includes a first electrode 750A of the storage capacitor formed as the same metal layer as the first gate electrode 416 on the same layer as the first gate electrode 416, a third electrode 750C of the storage capacitor formed of the same metal material as that of the first light-blocking pattern BSM-1 on the same layer as the first light-blocking pattern BSM-1, a second electrode 750B of the storage capacitor disposed between the first electrode 750A of the storage capacitor and the third electrode 750C of the storage capacitor, and a fourth electrode 750D of the storage capacitor formed as the same metal layer as the second gate electrode 478 on the same layer as the second gate electrode 478. In addition, the first electrode 750A of the storage capacitor and the third electrode 750C of the storage capacitor are electrically connected to each other, and the second electrode 750B of the storage capacitor and the fourth electrode 750D of the storage capacitor are electrically connected to each other. As a result, the storage capacitor Cst includes a plurality of sub-storage capacitors therein, and the sub-storage capacitors may be connected to each other in parallel to increase the capacitance of the capacitor.

In addition, the first electrode 750A of the storage capacitor may be formed by the same mask process together with the first gate electrode 416, the third electrode 750C of the storage capacitor may be formed by the same mask process together with the first light-blocking pattern BSM-1, and the fourth electrode 750D of the storage capacitor may be formed by the same mask process together with the second gate electrode 478, thereby contributing to process simplification.

Figure 8:
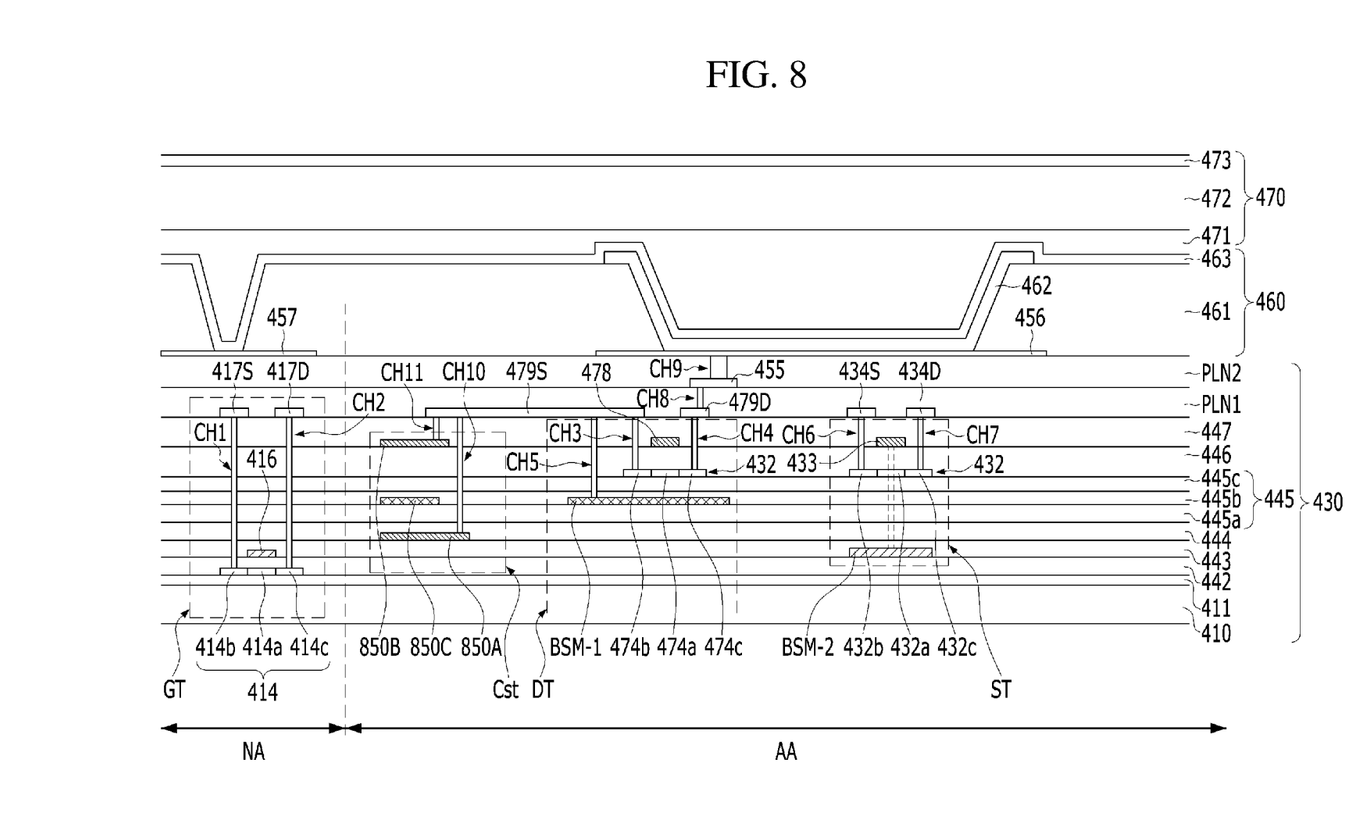
FIG. 8 is a cross-sectional view of one thin film transistor disposed in a gate-driving circuit part of a non-display region, and a driving TFT, a switching TFT, and a storage capacitor disposed in a display region according to a fifth embodiment of the present disclosure.

Meanwhile, an organic light-emitting display apparatus according to a fifth embodiment of the present embodiment will be examined with reference to FIG. 8.

The fifth embodiment has the same configuration as that of the first embodiment except that the storage capacitor Cst has a different configuration from that of the first embodiment.

In the fifth embodiment, the storage capacitor Cst includes a first electrode 850A of the storage capacitor, which may be a separate metal layer, disposed between the first gate electrode 416 and the first light blocking pattern BSM-1, a second electrode 850B of the storage capacitor, which may formed as the same metal layer as the second gate electrode 478 on the same layer as the second gate electrode 478, and a third electrode 850C of the storage capacitor, which is disposed between the first electrode 850A of the storage capacitor and the second electrode 850B of the storage capacitor and may be formed of the same metal material as that of the first light-blocking pattern BSM-1 on the same layer as the first light-blocking pattern BSM-1.

The first electrode 850A of the storage capacitor and second electrode 850B of the storage capacitor are electrically connected to each other.

As described above, the storage capacitor of the present disclosure has sub-storage capacitors connected to each other in parallel therein, and the electrode of the capacitor is formed of a metal layer to increase the capacity of the storage capacitor. As a result, the area, in which the storage capacitor is installed, per unit area may be reduced, and thus it is possible to respond to the trend toward higher resolution of the display device.

Referring to FIG. 4, a first planarization layer PLN1 is formed on the substrate 410 on which the driving thin film transistor DT and the first switching thin film transistor ST are disposed. The first planarization layer PLN1 may be formed of an organic material such as photoacryl, and may include a plurality of layers including an inorganic layer and an organic layer. A connection electrode 455 is formed on the first planarization layer PLN1. The connection electrode 455 is connected to an anode electrode 456, which is an element of a light-emitting element part 460, through a ninth contact hole CH9 and is connected to the second drain electrode 479D through an eighth contact hole CH8, thereby electrically connecting a pixel circuit part 430 and the light-emitting element part 460 to each other.

A second planarization layer PLN2 may be formed on the connection electrode 455. Similar to the first planarization layer PLN1, the second planarization layer PLN2 may be formed of an organic material such as photoacryl, and may include a plurality of layers including an inorganic layer and an organic layer.

The anode electrode 456 connected to the connection electrode 455 through the ninth contact hole CH9 is formed on the second planarization layer PLN2. The anode electrode 456 includes a single layer or a plurality of layers made of a metal such as Ca, Ba, Mg, Al, or Ag, or an alloy thereof. In addition to the anode electrode 456, an anode connection electrode 457 electrically connecting a common voltage wire VSS and a cathode electrode 463 may be further provided in the non-display region NA.

A bank layer 461 is formed on the second planarization layer PLN2. The bank layer 461 is a type of barrier rib, and may prevent or at least reduce light of a specific color output from an adjacent subpixel from being mixed and output by partitioning each subpixel.

An organic light-emitting layer 462 is formed on the anode electrode 456 and on a portion of a region of an inclined surface of the bank layer 461. The organic light-emitting layer 462 may be formed in each subpixel and may be an R-organic light-emitting layer emitting red light, a G-organic light-emitting layer emitting green light, and a B-organic light-emitting layer emitting blue light. In addition, the organic light-emitting layer 462 may be a W-organic light-emitting layer emitting white light.

In addition to a light-emitting layer, the organic light-emitting layer 462 may include an electron injection layer and a hole injection layer for injecting electrons and holes, respectively, into the light-emitting layer, and an electron transport layer and a hole transport layer for transporting the injected electrons and holes, respectively, to the organic layer.

The cathode electrode 463 is formed on the organic light-emitting layer 462. The cathode electrode 463 may be made of a transparent conductive material such as indium tin oxide (ITO) or indium zinc oxide (IZO) or a thin metal through which visible light is transmitted, but is not limited thereto.

An encapsulation layer portion 470 is formed on the cathode electrode 463. The encapsulation layer portion 470 may include a single inorganic layer, may include two layers, that is, an inorganic layer and an organic layer, or may include three layers, namely an inorganic layer, an organic layer, and an inorganic layer. The inorganic layer may include an inorganic material such as SiNx or $SiO_2$, but is not limited thereto. In addition, the organic layer may include an organic material such as polyethylene terephthalate, polyethylene naphthalate, polycarbonate, polyimide, polyethylene sulfonate, polyoxymethylene, or polyarylate, or a mixture thereof, but is not limited thereto.

In FIG. 4, as an embodiment of the encapsulation layer portion 470, a configuration of three layers, namely an inorganic layer 471, an organic layer 472, and an inorganic layer 473, is disclosed.

A cover glass (not illustrated) may be disposed on the encapsulation layer portion 470 and attached by an adhesive layer (not illustrated). As the adhesive layer, any material may be used, as long as the material has excellent adhesion, heat resistance, and water resistance, and in the present disclosure, it is possible to use a thermosetting resin such as an epoxy compound, an acrylate compound, or an acrylic rubber. In addition, a photocurable resin may be used as the adhesive layer, in which case the adhesive layer is cured by irradiating the adhesive layer with light such as ultraviolet.

The adhesive layer may not only bond the substrate 410 and the cover glass (not illustrated) but also serve as an encapsulant for preventing moisture from penetrating into the organic light-emitting display apparatus.

In the cover glass (not illustrated), as an encapsulation cap for encapsulating the organic light-emitting display apparatus, it is possible to use a protective film, such as a polystyrene (PS) film, a polyethylene (PE) film, a polyethylene naphthalate (PEN) film, or a polyimide (PI) film, or to use glass.

Referring to FIG. 4 as the embodiment of the present disclosure, in the subpixel, one driving thin film transistor DT using an oxide semiconductor material as an active layer and one switching thin film transistor ST using an oxide semiconductor material as an active layer are disclosed. However, the subpixel may further include a third switching thin film transistor using a polycrystalline semiconductor material as an active layer. In addition, it is possible to adopt a form in which every thin film transistor disposed in the subpixels is formed of an active layer made of an oxide semiconductor material.

In the organic light-emitting display apparatus of the present disclosure, by disposing capacitor electrodes connected to each other in parallel in order to ensure sufficient capacitance within a small area, it is possible to implement a pixel circuit capable of ensuring sufficient capacitance within a unit area even when the display device realizes high resolution. In addition, the capacitance of the capacitor may be increased by using metal patterns for all electrodes included in the capacitor.

In addition, by using different semiconductor patterns, a capacitor having a high capacitance may be implemented while reducing a mask process in a pixel stack structure having a stack structure of a plurality of inorganic insulating layers and metal layers.

The above description and the accompanying drawings are merely illustrative of the technical idea of the present disclosure, and those of ordinary skill in the art to which the present disclosure pertains may make various modifications or variations, such as combination, separation, substitution and change of configuration, within a range that does not depart from the essential characteristics of the present disclosure. Therefore, the embodiments disclosed in the present disclosure are not intended to limit the present disclosure, but merely to describe the technical spirit thereof, and the scope of the technical spirit of the present disclosure is not limited by these embodiments. The protection scope of the present disclosure should be construed based on the following claims, and all technical ideas within the scope equivalent thereto should be construed as being within the scope of the present disclosure.

What is claimed is:

1. An organic light-emitting display apparatus comprising:
    a substrate including a display region and a non-display region around the display region;
    a lower buffer layer on the substrate;
    a first thin film transistor in at least one of the display region and the non-display region, the first thin film transistor including a first semiconductor pattern, a first gate electrode, a first source electrode, and a first drain electrode on the lower buffer layer;
    an upper buffer layer on the first semiconductor pattern;
    a second thin film transistor on the upper buffer layer, the second thin film transistor including a second semiconductor pattern, a second gate electrode, a second source electrode, and a second drain electrode;
    a first light-blocking pattern between the lower buffer layer and the second semiconductor pattern, the first light-blocking pattern overlapping the second semiconductor pattern; and
    a storage capacitor including a first storage capacitor electrode on a same layer as the first gate electrode, a second storage capacitor electrode on a same layer as one of the second gate electrode and the first light-blocking pattern and is connected to the first storage capacitor electrode, and a third storage capacitor electrode between the first storage capacitor electrode and the second storage capacitor electrode,
    wherein the first light-blocking pattern is on the upper buffer layer.

2. The organic light-emitting display apparatus according to claim 1, wherein the second semiconductor pattern is an oxide semiconductor pattern.

3. The organic light-emitting display apparatus according to claim 1, wherein the second thin film transistor is a driving thin film transistor.

4. The organic light-emitting display apparatus according to claim 1, wherein the first light-blocking pattern is electrically connected to the second source electrode.

5. The organic light-emitting display apparatus according to claim 1, wherein the second storage capacitor electrode is a metal layer on the same layer as the first light-blocking pattern, and a sub-storage capacitor generated between the first storage capacitor electrode and the third storage capacitor electrode and a sub-storage capacitor generated between the second storage capacitor electrode and the third storage capacitor electrode are connected to each other in parallel.

6. The organic light-emitting display apparatus according to claim 1, wherein the second storage capacitor electrode is on the same layer as the second gate electrode, and the third storage capacitor electrode is on the same layer as the first light-blocking pattern.

7. The organic light-emitting display apparatus according to claim 1, wherein the second storage capacitor electrode is on the same layer as the second gate electrode, and the third storage capacitor electrode is a metal layer between the first light-blocking pattern and the first gate electrode.

8. The organic light-emitting display apparatus according to claim 1, further comprising:
    a fourth storage capacitor electrode as a metal layer on the same layer as the second gate electrode and connected to the third storage capacitor electrode,
    wherein the second storage capacitor electrode is on the same layer as the first light-blocking pattern.

9. The organic light-emitting display apparatus according to claim 1, wherein the upper buffer layer has a multi-layer structure including a sub-upper buffer layer comprising a silicon nitride film.

10. The organic light-emitting display apparatus according to claim 1, wherein the first storage capacitor electrode, the second storage capacitor electrode, and the third storage capacitor electrode include metal layers.

11. The organic light-emitting display apparatus according to claim 1, wherein the first thin film transistor includes:
    the first semiconductor pattern and the first gate electrode overlapping the first semiconductor pattern with a first gate insulating layer interposed between the first semiconductor pattern and the first gate electrode; and
    the first source electrode and the first drain electrode are on a plurality of inorganic insulating layers that are on the first gate electrode, and
    wherein the second thin film transistor includes:
    the second semiconductor pattern and the second gate electrode overlapping the second semiconductor pattern with a second gate insulating layer interposed between the second semiconductor pattern and the second gate electrode; and
    the second source electrode and the second drain electrode on an inorganic insulating layer that is on the second gate electrode.

* * * * *